United States Patent [19]

Baldi

[11] Patent Number: 5,372,956
[45] Date of Patent: Dec. 13, 1994

[54] METHOD FOR MAKING DIRECT CONTACTS IN HIGH DENSITY MOS/CMOS PROCESSES

[75] Inventor: Livio Baldi, Agrate Brianza, Italy

[73] Assignee: SGS-Thomson Microelectronics S.r.l., Agrate Brianza, Italy

[21] Appl. No.: 153,620

[22] Filed: Nov. 17, 1993

[30] Foreign Application Priority Data

Nov. 18, 1992 [EP] European Pat. Off. ........ 92830625.7

[51] Int. Cl.⁵ .......................................... H01L 21/265
[52] U.S. Cl. ........................................ 437/34; 437/41; 437/44; 437/45; 437/203
[58] Field of Search .................. 437/34, 40, 41, 43, 437/44, 45, 57, 56, 58, 59, 203

[56] References Cited

U.S. PATENT DOCUMENTS

| | | | |
|---|---|---|---|
| 4,918,026 | 4/1990 | Kosiak et al. | 437/59 |
| 4,988,633 | 6/1991 | Josquin | 437/34 |
| 4,994,894 | 2/1991 | Nakayama | . |
| 5,082,796 | 2/1992 | El-Diwany et al. | . |
| 5,102,827 | 4/1992 | Chen et al. | 437/34 |
| 5,115,296 | 5/1992 | Hsue et al. | 437/41 |
| 5,124,272 | 6/1992 | Saito et al. | 437/44 |
| 5,229,326 | 7/1993 | Pennison et al. | 437/203 |
| 5,242,844 | 9/1993 | Hayashi | 437/40 |
| 5,315,150 | 5/1994 | Furuhata | 437/203 |

Primary Examiner—Brian E. Hearn
Assistant Examiner—Kevin M. Picardat
Attorney, Agent, or Firm—Wolf, Greenfield & Sacks

[57] ABSTRACT

Highly reliable direct contacts may be formed by defining a direct contact area within a larger area purposely implanted and diffused for ensuring electrical continuity in the semiconductor. Patterning may define the contacting polysilicon within an implanted direct contact area so that the definition edges thereof fall on a gate oxide layer thus preventing an etching of the semiconductor during the unavoidable over-etching that concludes the polysilicon patterning step. Preferably, a pre-definition of the direct contact area is performed through a first, deposited layer of polysilicon, which effectively protects a gate oxide layer during a HF wash prior to depositing a second, contacting layer of polysilicon of adequate thickness.

16 Claims, 4 Drawing Sheets

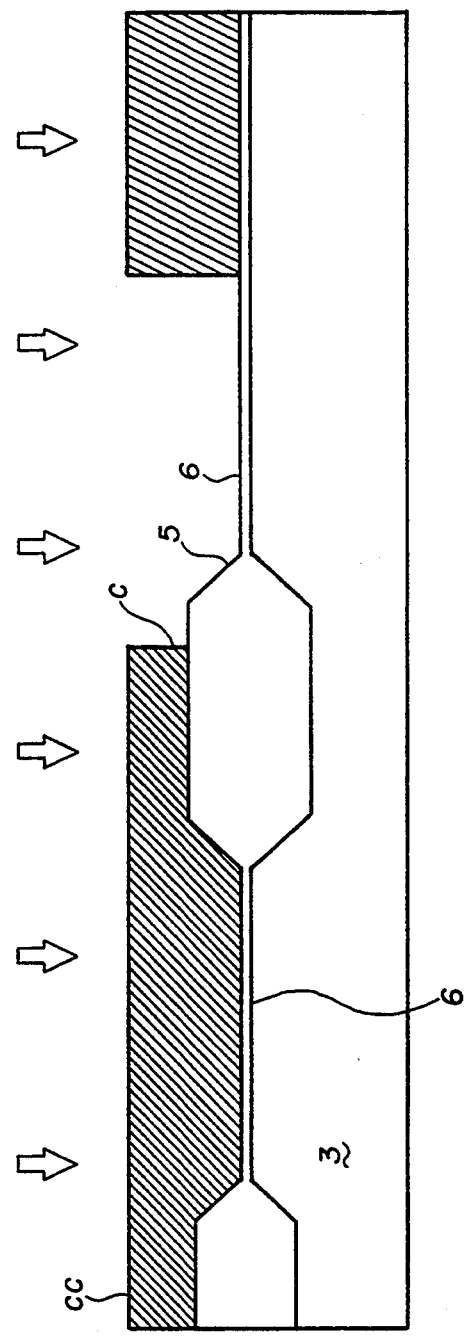
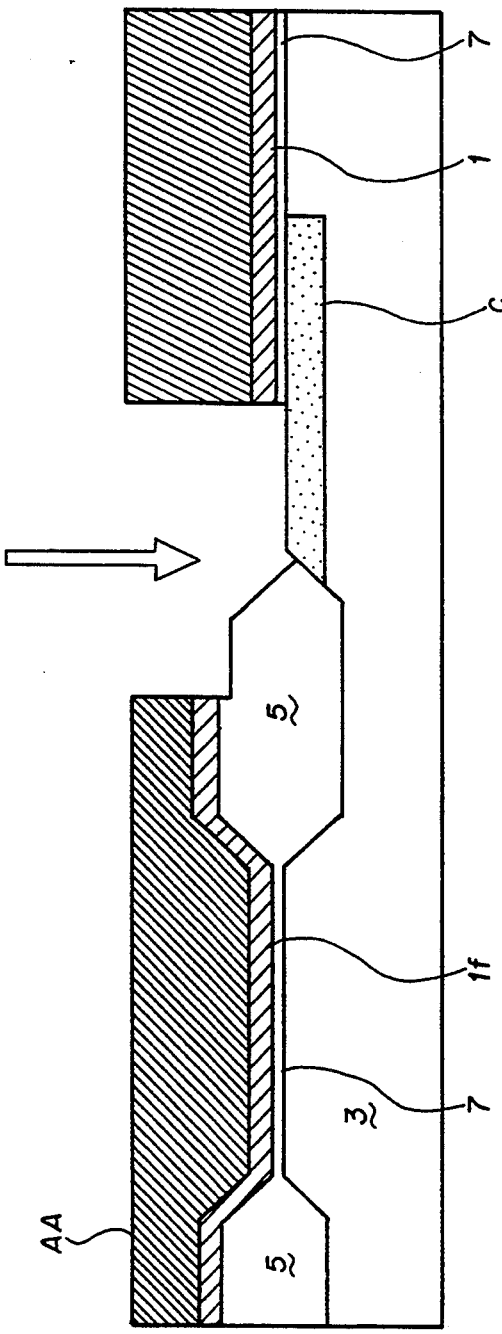
FIG. 3A
DIRECT CONTACT MASK APERTURE
FIG. 3B

METHOD FOR MAKING DIRECT CONTACTS IN HIGH DENSITY MOS/CMOS PROCESSES

BACKGROUND OF THE INVENTION

1. Field of the Invention

The present invention relates to a process for forming so-called "direct contacts" in integrated devices.

2. Discussion of the Related Art

In MOS and in CMOS integrated circuits the need of establishing an electrical connection between a drain or source diffusion (e.g., between an output node of a logic gate) and a polysilicon gate structure (e.g., an input node of another logic gate of the integrated circuit) is encountered often.

This connection may of course be made by a customary metal connection, but this solution is rather burdensome in terms of occupied area, because it requires the formation of two contact windows through a dielectric layer and of the relative contact "heads" or plugs. Moreover, the use of a patterned metal segment for establishing the connection restricts the room for other connections by constituting a "forbidden" zone that must eventually be avoided by going around it or by over-passing it through an upper level of metallization.

The area requirement for these connections is particularly penalizing in the case of certain integrated circuits, like SRAMs, wherein maximum compactness is desired.

A preferable alternative consists in forming a so-called direct contact between a patterned polysilicon gate structure and a certain source or drain area of the semiconductor, without using an overlaying metal layer for making the connection.

A direct contact must ensure the formation of a good ohmic contact between a film or layer of conducting material, commonly an n-doped polycrystalline silicon (polysilicon), and the semiconducting substrate, commonly a semiconducting silicon monocrystal. An essential requisite to achieve this is to ensure the removal of any residue of oxide in the contact area, including the so-called "native" oxide, i.e., a thin layer of oxide which spontaneously forms on the surface of a silicon monocrystal when exposed to air at room temperature in the contact area. Normally, for masking a direct contact, it is necessary to etch through a suitable mask, a dielectric layer (a gate oxide layer) in the area where the contact must be established. Moreover it is necessary to ensure the removal of any native oxide immediately before depositing the contacting layer, commonly of polysilicon. Removal of a native oxide film is normally done by washing the wafer in a solution containing chemical agents having a particular aggressiveness toward the oxide, such as for example hydrofluoric acid (HF).

The drawback of this type of washing operation for removing the film of native oxide is represented by the fact that the gate oxide layer that is present on the remaining portions of the active areas is also subjected to a hardly controllable and intrinsically nonuniform etching, which may cause an intolerable spread of the electrical parameters of the integrated devices. These problems are already serious in present-day CMOS processes and will become even more so in processes of future generation because of the tendency to utilize a gate oxide layer having an extremely small thickness (less than 20 nm).

Special techniques for removing the film of native oxide from contact areas have been reported. One of these techniques employs a special dry-cleaning machine that uses anhydrous HF instead of a solution thereof. These machines, under optimized working conditions, are reportedly capable of etching the native oxide which forms spontaneously on contact areas in a sufficiently selective manner versus the gate oxide layer that by contrast has been thermally grown. Reportedly this technique has the drawback of being very sensitive to the real working conditions and this may lead to a poor reproducibility in production.

In a prior European patent application, No. 92830540.8, filed on September 30, 1992 by the same applicant of the present invention, an improved method is described for forming direct contacts that consists in defining and "opening" a contact area through a first layer of conducting material, typically of polycrystalline silicon or briefly of polysilicon, which is purposely deposited beforehand over a dielectric gate layer present on active areas of the wafer.

The presence of a protective first layer of polysilicon permits to remove the film of native oxide from the contact area on the surface of the monocrystalline silicon substrate under conditions of practically absolute protection of the gate dielectric present on the other portions of active area.

A second layer of adequate thickness of polysilicon is eventually deposited in direct contact with the substrate in the freshly cleaned contact area and over said first layer.

Even though this new method overcomes some specific difficulties of the methods of the prior art it retains a critical aspect. According to such a method, schematically depicted in FIGS. 1A and 1B, as well as in previously known methods, in order to guarantee electrical continuity between the contacting polycrystalline silicon 1 and the region 2 of the semiconducting substrate, it is necessary that the aperture A of the mask used for defining the direct contact area be wider than the patterned strip of polycrystalline silicon 1, as depicted in FIG. 1A. Otherwise, the patterned polysilicon 1, by laying over a gate oxide layer beyond the definition border of the direct contact area, would unduly constitute a gate and therefore could eventually interrupt electrical continuity in the semiconductor.

Within such a wider definition area A of a direct contact, the gate dielectric (oxide) is removed at the end of the etching that is conducted initially through the thickness of a first protective layer of deposited polycrystalline silicon, thus pre-arranging the so defined direct contact area to receive a second deposited layer of polycrystalline silicon, or a single polycrystalline silicon layer, in the case of processes known before the invention described in said prior European patent application. The subsequent patterning step of the polycrystalline silicon through a mask defining the gate structures of transistors, necessarily implies also the carrying out of a certain over-etching to eliminate residues of polycrystalline silicon along "discontinuities" of the surface profile as well as for the necessity to account for nonuniformities of the thickness of the deposited polycrystalline silicon layer. This need would be intrinsically more pronounced in the case of the method of said prior patent application because of the two-step deposition process. Customarily, for a thickness of deposited polysilicon of about 0.4 $\mu$m, it is necessary to perform the etching for an "equivalent" apparent thickness of about 0.6 $\mu$m. Such an over-etching that generally does not represent a problem, because the etching is "arrested" by the gate oxide or by the field oxide present under the polycrystalline silicon layer, becomes a problem within direct contacts' definition areas because the gate oxide is no longer present within said relatively wider definition area. In these portions of the definition area of a direct contact the over-etching of the polycrystalline silicon inevitably produces also a certain etching of the semiconducting silicon substrate 3, as evidenced in the schematic cross section of 1B. The etching of the silicon substrate 3 can hardly be prevented because it is not possible to obtain a sufficient etch selectivity between polycrystalline silicon and monocrystalline silicon.

Such an undesirable cutting of the silicon substrate in the area of definition of a direct contact is proportionally greater when the thickness of the polycrystalline silicon layer over this area is smaller than the thickness of the polycrystalline silicon layer over the rest of the surface, as in the case of the method of the above-noted prior patent application wherein the thickness of the layer of polycrystalline silicon within the area of definition of a direct contact corresponds to the thickness of only the second deposited layer. As a consequence, a marked etching of the monocrystalline silicon substrate occurs in this area and this may affect the functionality of the integrated circuit if it is not sufficiently controlled. In view of the fact that the doping of drain and source regions is performed by ion implantation, i.e., under intrinsically anisotropic conditions, it may happen that, in presence of an excessive cutting of the semiconducting silicon substrate and of relatively shallow junction depths (diffusions) typical of sub-micron processes, the implanted and diffused region 2b at the bottom of the etched zone may not be electrically connected to the implanted and diffused region 2 of the rest of the region to be contacted.

An object of the present invention is that of overcoming this problem.

SUMMARY OF THE INVENTION

The method for forming a direct contact between a conducting gate layer and a semiconductor device terminal region is based upon the definition of an area of a semiconducting substrate, in which a direct contact must be formed, having dimensions which are essentially smaller than the dimensions of definition of an overlaid contacting layer (commonly of polysilicon). This prevents the etching of the semiconducting substrate when performing a necessary over-etch of the overlaid conducting layer for eliminating residues along discontinuities of the profile of the surface at the end of the etching step for patterning the conducting layer in order to define the gate structures of the various MISFET devices. Electrical continuity between the region of the substrate contacted through the "direct contact" with a patterned portion of the conductive gate structure and an implanted and diffused source or drain region which is eventually formed in the semiconductor, is established by purposely forming an electrical continuity diffused region. This connecting region is obtained by implanting and diffusing a dopant in an area, defined by masking, which geometrically overlaps or interferes with at least a portion of said area of definition of a direct contact and with at least a portion of the area of said subsequently formed source/drain region (i.e., semiconductor device terminal region) of the substrate to be contacted.

According to a first embodiment of the invention, a pre-implantation of such an area geometrically overlapping at least partially the definition area of a direct contact and the area of the source/drain region to be contacted, may conveniently be performed during the implantation step that is normally carried out for forming integrated capacitors, of course when this is contemplated by the fabrication process of the integrated circuits, as for example in the case of EEPROM memories or of integrated circuits for analog applications containing integrated capacitors, and the like. In these instances, the same mask that is employed for defining and implanting the areas of capacitors areas, may be conveniently modified so as to define and implanting also the zones where direct contacts must be established. Also in the fabrication of NAND-organized ROMs that are programmed by a dopant implantation before depositing the polycrystalline silicon gate layer, or through such a pre-deposited polysilicon layer by high energy implantation, the method of the invention may be conveniently implanted without requiring any additional mask.

In any case, the invention is applicable in principle to any MOS-CMOS process by introducing eventually an additional mask.

Even more preferably, the method of the present invention may be implemented within the process described in said prior patent application, thus exploiting the advantages of the process of said prior application while eliminating any critical aspect thereof.

According to such a preferred embodiment, doping of a portion of active area of adequate dimensions, as defined by a mask, adjacent to the edge of a thick field oxide layer (dielectric field isolation layer) that borders the active area, takes place in self-alignment to the edge of the field oxide. Thereafter the process of fabrication proceeds through the formation of a dielectric gate layer, commonly a thermally grown oxide, on the active area, followed by the deposition of a first layer of conducting material from which the gates of the devices will be patterned out, commonly of a layer of polycrystalline silicon.

Thereafter, definition and "opening" of the area in which the direct contact will be established are performed by masking and etching through said first deposited layer and through said dielectric gate layer until exposing the surface of the semiconducting substrate.

The aperture of the mask used for defining said contact area may have the minimum dimensions permitted by the particular lithographic process that is used.

After having deposited a second layer of polycrystalline silicon of a thickness adequate to form said gate structures, and doped the deposited polysilicon, patterning thereof is carried out so as to abundantly cover said defined area of direct contact with the contacting, patterned layer of doped polysilicon. The definition edges of the patterned polycrystalline silicon, outside the contact area, fall on the gate oxide layer and therefore etching of the semiconducting monocrystalline substrate is prevented during the over-etching conclusive phase of the polysilicon at the end of the gate patterning step, because of the high etch selectivity of polycrystalline silicon versus the oxide.

On the other hand, electrical connection between the contacted region and a source/drain region that is normally formed thereafter in the active area, is ensured by said connecting region formed by said pre-doping step. The dimensions of this continuity diffusion are such as to geometrically overlap or interfere both with the direct contact area and with the source or drain diffusion area to be contacted.

The different aspects and advantages of the invention will become more evident through the following description of an embodiment thereof and by referring to the annexed drawings.

BRIEF DESCRIPTION OF THE DRAWING

FIGS. 3A–3D show the main steps of a process for forming a direct contact according to the present invention.

DETAILED DESCRIPTION

Figure 1A:
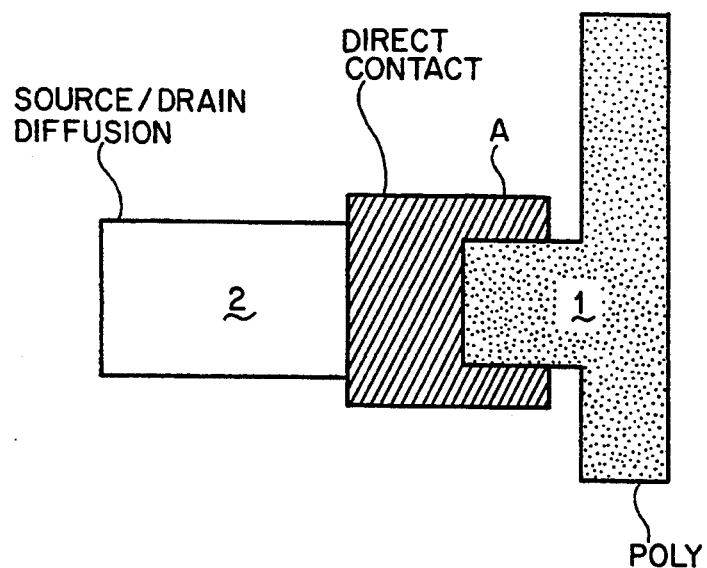
FIGS. 1A and 1B schematically illustrate the problem consequent of the over-etching step in patterning a polycrystalline silicon, as discussed herein above.
Figure 1B:
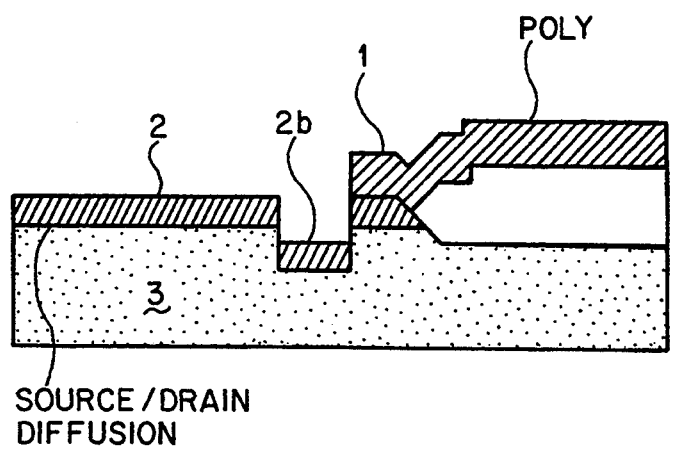

As already discussed herein above, FIGS. 1A and 1B put in evidence a critical aspect of the method for forming a direct contact described in said prior European patent application No. 92830540.8 whose content is herein incorporated by express reference.

Through the opening A of the mask used for defining the area of the direct contact, a first layer of polycrystalline silicon is etched and etching is continued for removing completely from the same area A also the underlying layer of gate oxide (4 in FIG. 2B) until exposing the semiconducting monocrystalline substrate 3. The subsequent deposition of a second layer of polycrystalline silicon takes place, in the area A, directly over and in contact with the substrate. A subsequent doping and patterning by masking of this layer of polycrystalline silicon forms conducting gate layer 1, including the gate structures and the direct contacts. This process necessarily defines the width of the strip of polycrystalline silicon 1 that establishes the direct contact as being geometrically contained entirely within the definition area A.

Therefore the necessary over-etching of polycrystalline silicon is not arrested, within area A, by the presence of a layer of gate oxide, because the layer of gate oxide within area A was removed. As a consequence, an etching of the silicon substrate 3 occurs. An excessive cutting of the monocrystal may produce an electrical discontinuity between the diffused region 2b which eventually forms at the bottom of the etched zone and a diffused region 2, which may represent a source or a drain junction and with which a direct contact with the gate structure (polysilicon 1) must be established.

Figure 2A:
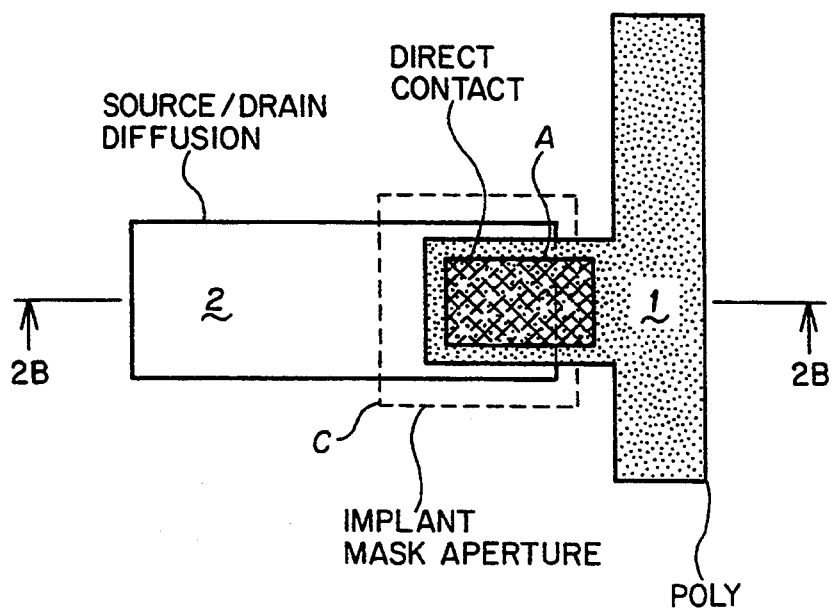
FIG. 2A is a plan view showing the layout of a direct contact made according to the present invention.
Figure 2B:
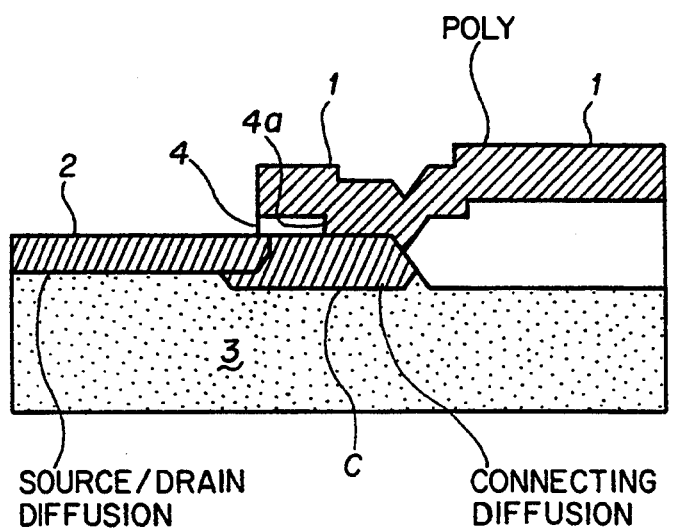
FIG. 2B is a cross section view along a section plane identified by the line X—X of FIG. 2A.

By contrast, according to the present invention, as schematically depicted in FIGS. 2A and 2B, the aperture A of the mask used for defining the area of direct contact has dimensions that are essentially smaller than the dimensions of the patterned conducting gate layer 1 (gate polysilicon), which is deposited and patterned over the direct contact area A. The electrical connection of the contact region of the substrate 3 with the diffused region 2 (a semiconductor device source/drain region, i.e., a source or drain junction that is subsequently formed in the active area) is realized by means of a connecting diffusion in area C. This diffused region in area C is purposely produced to encompass the contact region in the semiconducting substrate 3 by an implantation performed through the aperture C of a dedicated mask (FIG. 2A). The projected area of the aperture C overlaps geometrically the definition area A of the direct contact and a portion of area 2 of the source or drain diffusion with which an electrical connection with the gate structure 1 must be established through the direct contact.

Because the definition area A of the direct contact is completely inscribed within the perimeter of definition of conducting gate layer 1 (polysilicon), a definition edge 4a of the patterned polysilicon of conducting gate layer 1 in relation to the contact area is defined by and aligned with dielectric gate isolation (oxide) layer 4, as indicated in the schematic cross section of FIG. 2B. In this way, any etching of the monocrystalline substrate 3 is prevented during the over-etching step performed at the end of the patterning step of the gate polysilicon 1, because of the high etch selectivity of silicon versus the oxide.

On the other hand, the definition profile of the conducting gate layer of polysilicon 1 in the zone of the direct contact is in turn substantially inscribed within the definition area C, corresponding to the opening of the mask used for implanting the connecting diffusion.

A preferred embodiment of the method of the invention is schematically depicted in the series of FIGS. from 3A to 3D, wherein the basic steps of the process for forming a direct contact according to the present invention are illustrated.

The fabrication process may be a MOS or CMOS process and it may proceed in a substantially standard manner until the growth of a dielectric field isolation (oxide) layer 5 and the removal of a silicon nitride mask from active areas bounded by the grown field oxide 5. At this point a thin sacrificial layer of oxide 6 is commonly grown in the active areas.

A first step of the process of the invention for forming a direct contact consists in forming a mask CC, provided with an aperture C that coincides with a zone of an active area within which the direct contact must be formed. Mask CC may, in many cases, be the same mask used for defining integrated capacitors, suitably modified for defining also the areas within which direct contacts will be formed. Through aperture C of mask CC, an implantation is performed that, for n-channel processes may be carried out commonly with phosphorous or arsenic (n+), as schematically depicted in FIG. 3A.

Thereafter, mask CC is removed, sacrificial oxide layer 6 is removed from the active area, and a dielectric gate isolation layer 7 (e.g., a gate oxide layer) is grown. The implanted dopant is diffused and forms a diffused region C in the zone of the semiconducting substrate within which the direct contact will be formed.

By following the process described in said prior European patent application No. 92830540.8, a first relatively thin layer of polycrystalline silicon 1f may be deposited at this point.

Thereafter a second mask AA, for defining the direct contact areas, is formed. The aperture A of the mask may have the minimum dimensions as permitted by the photolithographic process used. Aperture AA defines a direct contact area which necessarily must remain contained within an area of definition of a conducting gate layer that will be deposited thereafter over the entire surface. Through this opening A the first deposited layer 1f of polycrystalline silicon is etched and etching is continued until the underlying layer of gate oxide 7 is also completely removed so as to expose the surface of the semiconducting monocrystalline substrate within zone C, which had been previously diffused, as schematically depicted in FIG. 3B.

After having removed mask AA and after having etched the native oxide from the contact area, a second layer 1s of polycrystalline silicon and/or of a silicide is deposited. Then the entire layer of conducting material $1f+1s$ is doped to give it an appropriate electrical conductivity.

Standard masking and etching steps for defining the gate structures are performed thereafter. The mask used for patterning the conducting gate layer $1f+1s$ has apertures that will ensure that the patterned conducting gate layer completely covers the direct contact area, and extends, at least on the side facing toward the diffused region to be contacted, beyond the border of the contact area by a length equivalent to or greater than the standard misalignment values typical of the apparatuses used. Of course, it is also necessary that the mask used for patterning the conducting gate layer has a profile (aperture) in the direct contact zone that will remain substantially inscribed within the area which was implanted through opening C of mask CC.

Figure 3C:
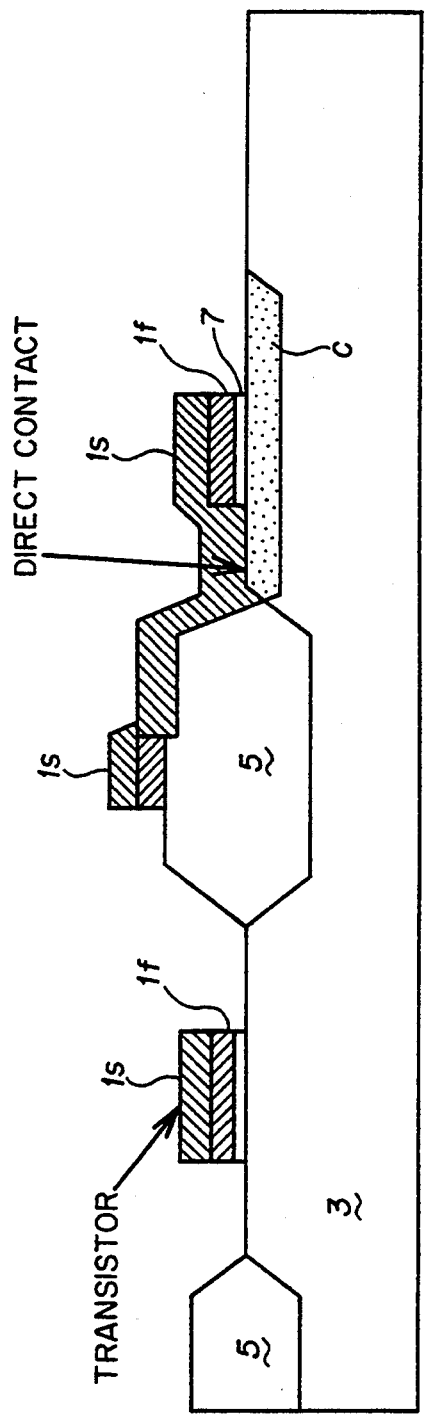

After having removed gate oxide 7 from the active area not covered by the patterned gate structure $1f+1s$, the cross section may be as depicted in FIG. 3C.

The fabrication process may continue thereafter according to a standard sequence of steps which may comprise a first LDD (Lightly Doped Drain) implantation of the source/drain areas, carried out in self-alignment with at least one defining edge of the conducting gate layer in the zone of the direct contact followed by the steps which lead to the formation of dielectric spacers 8 along the definition edges of the conducting gate layer $1f+1s$, by a further implantation and an annealing-/diffusing heat treatment which leads to a definitive formation of the drain/source junctions 2 (i.e., semiconductor device terminal regions).

Figure 3D:
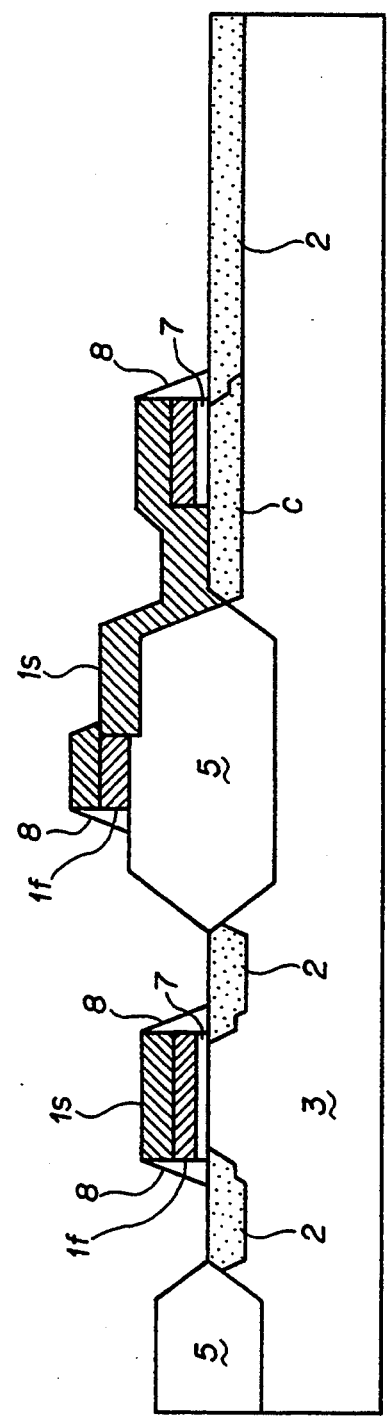

As may be observed in the cross section of FIG. 3D, the diffusion C, that had been previously formed, provides the electrical connection between the source or drain diffusion 2, with which a direct contact must be established, and the region of the substrate contacted by polysilicon layer $1f+1s$.

Many alterations are possible in the way the present invention is practiced while remaining within the scope of the present invention as defined in the annexed claims. In particular, the way in which the connecting diffusion C is formed may be different from the one shown in the series of FIGS. from 3A to 3D. The implantation of the dopant may take place after having removed the sacrificial oxide 6 or through the residual oxide present on the active areas after having removed a masking nitride layer. The same implantation may also be performed through a layer of gate oxide 7, before or after the opening of the direct contact areas, though in this case an increased defectivity of the gate oxide may be likely to occur. The implantation of the region C may also be performed through a first thin layer of polycrystalline silicon deposited before defining and opening the direct contact area or through the entire thickness of the conducting gate layer in case of a fabrication process for NAND-type ROM, programmed by high energy implantation. A further possibility is that of performing an n-type doping of the region where a direct contact will be formed by using the n-well mask of CMOS processes with a p-type substrate. This latter embodiment of the invention is more burdensome in terms of area requirements because of a greater lateral diffusion of a well.

The invention finds a particularly advantageous application in all CMOS processes where direct contacts must be formed and where dopant implantations for making integrated capacitors must be effected, or where depletion type memory cells or transistors must be formed.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method for forming a direct contact between a conducting gate layer and a semiconductor device terminal region of a semiconducting substrate in a portion of an active area bounded by a dielectric field isolation layer, comprising the steps of:

forming a dielectric gate isolation layer over said active area of said semiconducting substrate;

defining a direct contact area by masking a defined area, said defined area having dimensions which are essentially smaller than those of said conducting gate layer;

etching said dielectric gate isolation layer to expose said semiconducting substrate in said defined area; and implanting an implant zone geometrically overlapping at least a portion of said direct contact area and at least a portion of said terminal region, so as to produce a connecting diffusion in said semiconducting substrate forming said active area including said direct contact, said direct contact providing electrical continuity between said conducting gate layer and said terminal region.

2. A method according to claim 1, wherein said connecting diffusion is formed by implanting said implant zone before forming said gate isolation layer.

3. A method according to claim 1, wherein said connecting diffusion is formed by implanting said overlapping area using a high kinetic energy implantation technique.

4. A method according to claim 1, wherein said conducting gate layer is deposited over said direct contact area in two successive steps as a first layer and a second layer, the first layer being deposited before defining by masking said direct contact area, the second layer being deposited after defining by masking said direct contact area and after opening said direct contact area through said first layer and said gate isolation layer.

5. A method according to claim 1, wherein said direct contact is doped polysilicon.

6. A method for forming a direct contact between a conducting gate layer and a semiconductor device terminal region of a semiconducting substrate, said direct contact including a portion of an active area of said semiconducting substrate bounded by a dielectric field isolation layer, comprising the steps of:

defining an implant zone by masking a portion of said active area;

implanting and diffusing said implant zone with a dopant;

forming a dielectric gate isolation layer over said active area;

depositing a first conducting layer over said gate isolation layer and over said field isolation layer;

defining at least one edge of a direct contact area by masking a portion of said implant zone;

etching said first conducting layer and said gate isolation layer to expose said semiconducting substrate corresponding to said direct contact area;

depositing a second conducting layer over said substrate inside said direct contact area and over said first conducting layer outside said direct contact area;

forming a mask for patterning said conducting gate layer having a patterning profile around said direct contact area with dimensions that are essentially larger than dimensions of definition of said direct contact area and essentially smaller than dimensions of definition of said implant zone; and removing said dielectric gate layer from areas not covered by said conducting gate layer;

implanting and diffusing a dopant for forming a terminal region of a semiconductor device aligned with at least a definition edge of said conducting gate layer, said terminal region overlapping said direct contact area.

7. A method according to claim 6, wherein said first conducting layer is of polycrystalline silicon.

8. A method according to claim 7, wherein said second conducting layer is of a material belonging to the group consisting of doped polycrystalline silicon and silicide.

9. A method for forming a direct contact between a conducting gate layer and a semiconductor device terminal region of a semiconducting substrate, said direct contact including a portion of an active area of said semiconducting substrate bounded by a dielectric field isolation layer, comprising the steps of:

defining an implant zone by masking a portion of said active area;

implanting and diffusing said implant zone with a dopant;

forming a dielectric gate isolation layer over said active area;

depositing a first conducting layer over said gate isolation layer and over said field isolation layer;

defining at least one edge of a direct contact area by masking a portion of said implant zone;

etching said first conducting layer and said gate isolation layer to expose said semiconducting substrate corresponding to said direct contact area;

depositing a second conducting layer over said substrate inside said direct contact area and over said first conducting layer outside said direct contact area;

forming said conducting gate layer over and wholly covering said direct contact area, and wholly covered by said second layer;

removing said dielectric gate layer from areas not covered by said conducting gate layer; and implanting and diffusing a dopant for forming a terminal region of a semiconductor device aligned with at least a definition edge of said conducting gate layer, said terminal region overlapping said direct contact.

10. A method according to claim 9, wherein said first conducting layer is of polycrystalline silicon.

11. A method according to claim 9, wherein said second conducting layer is of a material belonging to the group consisting of doped polycrystalline silicon and silicide.

12. A method according to claim 9, wherein implanting and diffusing a dopant is performed after removing said dielectric gate layer.

13. A method according to claim 9, wherein implanting and diffusing a dopant is performed before removing said dielectric gate layer.

14. A method according to claim 9, wherein implanting and diffusing a dopant is performed through said gate isolation layer.

15. A method according to claim 9, wherein implanting and diffusing a dopant is performed through multiple layers using high energy implantation.

16. A method according to claim 9, wherein implanting and diffusing a dopant includes n-type doping using an n-well mask of CMOS processes with a p-type substrate.

* * * * *